United States Patent [19]

Smith

[11] 4,297,598

[45] Oct. 27, 1981

[54] I²L SENSING CIRCUIT WITH INCREASED SENSITIVITY

[75] Inventor: Kent F. Smith, Salt Lake City, Utah

[73] Assignee: General Instrument Corporation, Clifton, N.J.

[21] Appl. No.: 27,507

[22] Filed: Apr. 5, 1979

[51] Int. Cl.³ .......................... H03K 5/24; G11C 7/00
[52] U.S. Cl. .................................. 307/355; 307/291; 357/92; 365/155; 365/205
[58] Field of Search ................. 307/238, 355, DIG. 3, 307/291; 357/92; 365/154, 205, 155

[56] References Cited

U.S. PATENT DOCUMENTS 3,505,573  4/1970  Wiedmann ..................... 307/291 X
3,986,178  10/1976  McElroy et al. ................ 357/92 X

OTHER PUBLICATIONS

W. Cordaro et al., "Amoeba Sense Amplifier and Regenerator", IBM Technical Disclosure Bulletin, vol. 21, No. 4, Sep. 1978, pp. 1479-1482.

S. K. Wiedmann, "Injection-Coupled Memory: A High-Density Static Bipolar Memory", IEEE Journal of Solid-State Circuits, Oct. 1973, pp. 332-337, vol. SC-8, No. 5.

*Primary Examiner*—John Zazworsky
*Attorney, Agent, or Firm*—James & Franklin

[57] ABSTRACT

An I²L circuit is provided for sensing relatively small differences in magnitude between two input signals. A dual input bistable circuit generates an output representative of the degree to which each of the bistable circuit inputs is actuated, subsequent to the energization of the bistable circuit by a current source in the form of an injector transistor, which is disabled to reset the bistable circuit. A pair of load transistors are provided, the control terminals of which are, respectively, connected to receive the input signals. Each load transistor serves to actuate a different one of the bistable means inputs to a degree dependent upon the conductivity thereof, which, in turn, is dependent upon the magnitude of the input signal connected thereto. The load transistors also serve to isolate the source of the input signals from the energizing injector current, to prevent the sensing circuit from disrupting the state of the source of the input signals.

35 Claims, 3 Drawing Figures

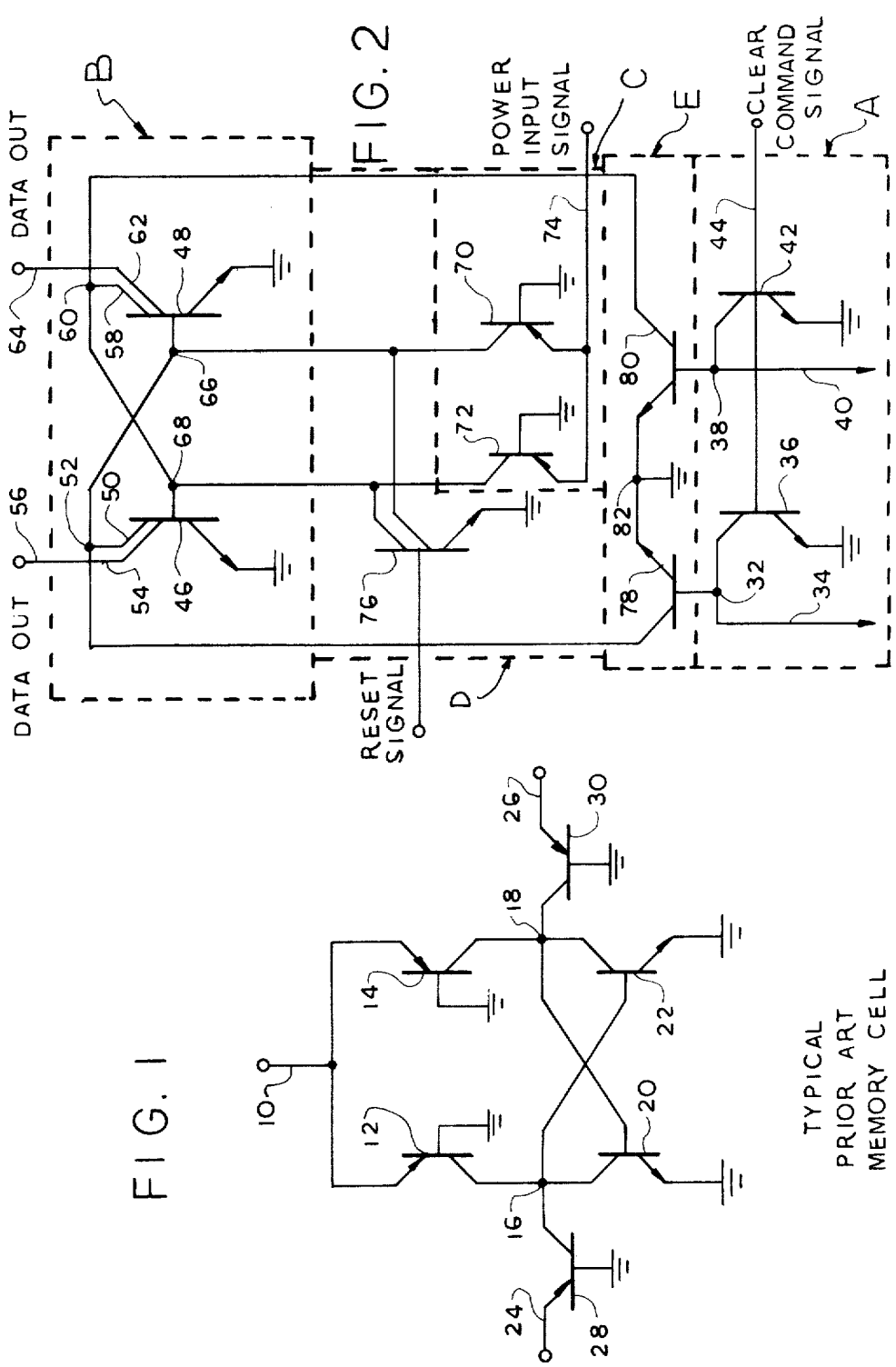

I²L SENSING CIRCUIT WITH INCREASED SENSITIVITY

The present invention relates to sensing circuits and, more particularly, to an I²L circuit for sensing relatively small differences in signal magnitudes between first and second input signals.

Sensing circuits of various configurations, producible in different processing technologies, such as bipolar, MOS, CMOS and the like, have been widely known and used. For example, differential amplifiers have been used in many different applications to sense the difference in magnitude between two input signals. Sense amplifiers have been used in many applications to sense the presence or absence of a signal, for instance, in memory applications wherein same are utilized to detect the state of a memory cell.

The continuous search for ways in which to increase circuit densities, speed and to lower power requirements has recently led to the emergence of integrated-injector logic (I²L) techniques. Because I²L circuits can operate faster than N-channel MOS, consume less power than complimentary MOS, and require relatively little chip space, it has been found that I²L is particularly well suited for manufacturing of random access memory circuits and the like.

The fundamental I²L logic circuit is a simple inverter which physically consists of a vertical NPN multi-emitter bipolar transistor, operated in the inverse mode. In that mode, the conventional bipolar NPN emitters perform as collectors. Base drive to the NPN transistor is supplied by a lateral PNP current source, commonly referred to as an injector. On the integrated circuit, the PNP injector is integrated or merged with the NPN transistor, in the bulk silicon. The use of I²L techniques in the fabrication of memory cells and associated circuitry is advantageous because of high speed, small size and low power consumption. Moreover, when designed in a particular manner, an I²L memory cell can be functionally controlled, that is, the cell can be caused to read, write, or stand-by, simply by altering the magnitude of the power signal input thereto. Such I²L memory cells, as disclosed by Siegrriend Wiedman in an article published in the *IEEE Journal of Solid-State Circuits*, Vol. Se-S No. 5, October 1973, entitled "Injection-Coupled Memory: A High Density Static Bipolar Memory", simply comprise a pair of cross-coupled, vertical PNP storage transistors fed by a pair of lateral PNP injector transistors connected to a power line. The cell employs two pass or transfer transistors, also of the lateral PNP injector type, which serve to connect each of the storage transistors to a separate one of a pair of data transfer buses or lines.

When the cell is in the stand-by condition, the input power signal is of a relatively low magnitude. When the information stored in the cell is to be read, the magnitude of the input power signal is raised causing each of two data transfer lines to receive a current through one of the pass transistors. One of the output currents has a slightly greater magnitude than the other output current, which different reflects the state of the cross-coupled storage transistors.

Because the power requirements of such an I²L memory cell are advantageously low, the magnitude of output currents applied to the data transfer lines are relatively low. However, the magnitudes of the output currents in this situation are not relevant because it is the difference between the current magnitudes flowing through the output lines which represents the state of the cell. This difference is extremely small and may be in the range of 100 nano-amperes or even less. It can, therefore, be appreciated that the circuit which senses the difference between the current magnitudes on the output lines must be extremely sensitive. Further, such a circuit must operate without destroying the state of the cell to which it is connected, and must be relatively simple in construction, have low power and space requirements and be compatible with I²L technology.

Even in situations where the relative differences in current magnitudes between two input signals are somewhat greater, it is often advantageous to be able to detect such differences very quickly. When such signals are simultaneously applied to two output lines, the difference in the current magnitudes between the lines start off very small and, over time, build up to a larger difference. When conventional sensing circuits are utilized, the lack of sensitivity of such circuits normally requires that the sensing operation be delayed until the current difference has developed to an appreciable extent. However, with a more sensitive sensing circuit, the time required can be reduced significantly by sensing the differences initially, that is, before same build up. Thus, a sensing circuit with increased sensitivity may have the advantage of increased speed in certain applications.

It is, therefore, a prime object of the present invention to provide a circuit for sensing relatively small differences in signal magnitude between first and second input signals.

It is another object of the present invention to provide a sensing circuit which may be implemented in I²L technology.

It is a further object of the present invention to provide a sensing circuit which has increased speed capabilities.

It is still another object of the present invention to provide a sensing circuit for use in non-destructively sensing the output of a memory cell in an I²L random access memory.

It is still another object of the present invention to provide a sensing circuit which is capable of detecting differences in current magnitude in the nano-ampere range.

It is still another object of the present invention to provide a sensing circuit with relatively low power and size requirements.

It is still another object of the present invention to provide a sensing circuit of relatively simple I²L configuration.

In accordance with the present invention, an I²L circuit for sensing relatively small differences in signal magnitude between first and second input signals is provided. First and second means are adapted to receive the first and second input signals, respectively. Dual input bistable means generate an output representative of the degree to which the bistable means inputs are actuated, subsequent to the resetting of the bistable means. Means are provided for supplying current to said bistable circuit. Means are provided for resetting the bistable means. Means, operably connected to the bistable means inputs and the receiving means, are provided to actuate the bistable means inputs, respectively, to degrees which are dependent upon the magnitudes of the input signals applied to the first and second receiving means.

The receiving means preferably comprises means for clearing the circuit inputs. The clearing means is responsive to a clear command signal which is generated for a time prior to the application of the input signals to the receiving means.

The resetting means comprises means for de-energizing the bistable means. The resetting means comprise means for disabling the energizing means either by cutting off the power supply thereto or by grounding the output thereof. The energizing means preferably comprises one or more injector transistors and means for providing a source of power thereto. The disabling means may comprise means for disabling the power source means, that is, for cutting off the power to the injector transistor, or may comprise means for grounding the output circuit of the injector transistor, In either case, the disabling means is responsive to a reset command signal which is normally applied during the application of the clear command signal and for a brief period thereafter. During the presence of the reset command signal, power to the bistable means is cut off so as to turn off the cross-coupled storage transistors which comprise the bistable means. When the resetting command signal terminates, both of the cross-coupled storage transistors which form the bistable means are energized simultaneously.

Once the bistable means is energized and the circuit operational, there is a danger that the current supplied to the bistable means by the injector transistors will be fed back through the first and second receiving means to the first and second circuit inputs. If the sensing circuit is utilized in a random access memory to sense the output of a memory cell, the application of a current on the data transfer lines during the read operation has the potential of disrupting the state of the cell. This, of course, is not permissible in non-destructive read-out situations.

In order to overcome this problem, the actuation means must also function as a means for isolating the receiving means from the bistable means. In other words, the actuation means must act to prevent current from the injector transistor from passing through the receiving means onto the data transfer lines. It must, however, accomplish this function and still act to cause the relatively small difference in current magnitudes in the data transfer lines to set the state of the bistable means. This is accomplished by having the actuation means comprise first and second load transistors, each having a control terminal and an output circuit. Each of the control terminals is operably connected to one of the receiving means. Each of the output circuits is operably connected between ground and a different one of the bistable means inputs. In this manner, each of the transistors in the actuation means acts as a load for one of the cross-coupled storage transistors in the bistable means, magnifying the current difference in the input signals, and, at the same time, preventing the injector current from reaching the circuit inputs.

The bistable means comprises a first and second cross-coupled storage transistors, preferably, of the vertical NPN transistor type, each having two emitters operated as collectors. Each of the storage transistors is connected to and energized by an injector transistor, preferably, a lateral PNP current source whose emitter is connected to power the storage transistor. Two different injector transistors, one for each storage transistor, may be provided. Alternatively, a single injector transistor having two emitters, one connected to each of the storage transistors, may be utilized.

The operation of the sensing circuit is quite simple. The reset command signal and the clear command signal serve to turn off the bistable means and to clear the receiving means. The clear command signal terminates and the signals to be detected are applied to the first and second receiving means, respectively. Thereafter, the reset command signal terminates, permitting the injector transistor to act as a current source for the cross-coupled storage transistors in the bistable means. Each of the load transistors are connected between one of the receiving means and one of the inputs of the bistable means. The conductivity of each transistor determines the degree to which the bistable means input connected thereto is actuated. The input signal with the greater magnitude causes the load transistor associated therewith to become more conductive than the other load transistor. The bistable means will assume a state which reflects the relative degree to which its inputs are actuated. The current injected by the injector transistor into the cross-coupled storage transistors causes the bistable means to maintain this stable state and to generate an output which is a function of same. The load transistors serve the additional important function of isolating the receiving means from the current supply output of the injector transistors such that the current generated by the injector transistor cannot be fed back through the receiving means to disrupt the input signal source.

To the accomplishment of the above, and to such other objects as may hereinafter appear, the present invention relates to an I²L sensing circuit of increased sensitivity, as set forth in the following specification and recited in the annexed claims, taken together with the accompanying drawings, wherein like numerals refer to like parts, and in which:

FIG. 1 is a schematic diagram of a prior art memory cell usable in conjunction with the sensing circuit of the present invention;

FIG. 2 is a schematic diagram of the sensing circuit of the present invention.

Figure 3:
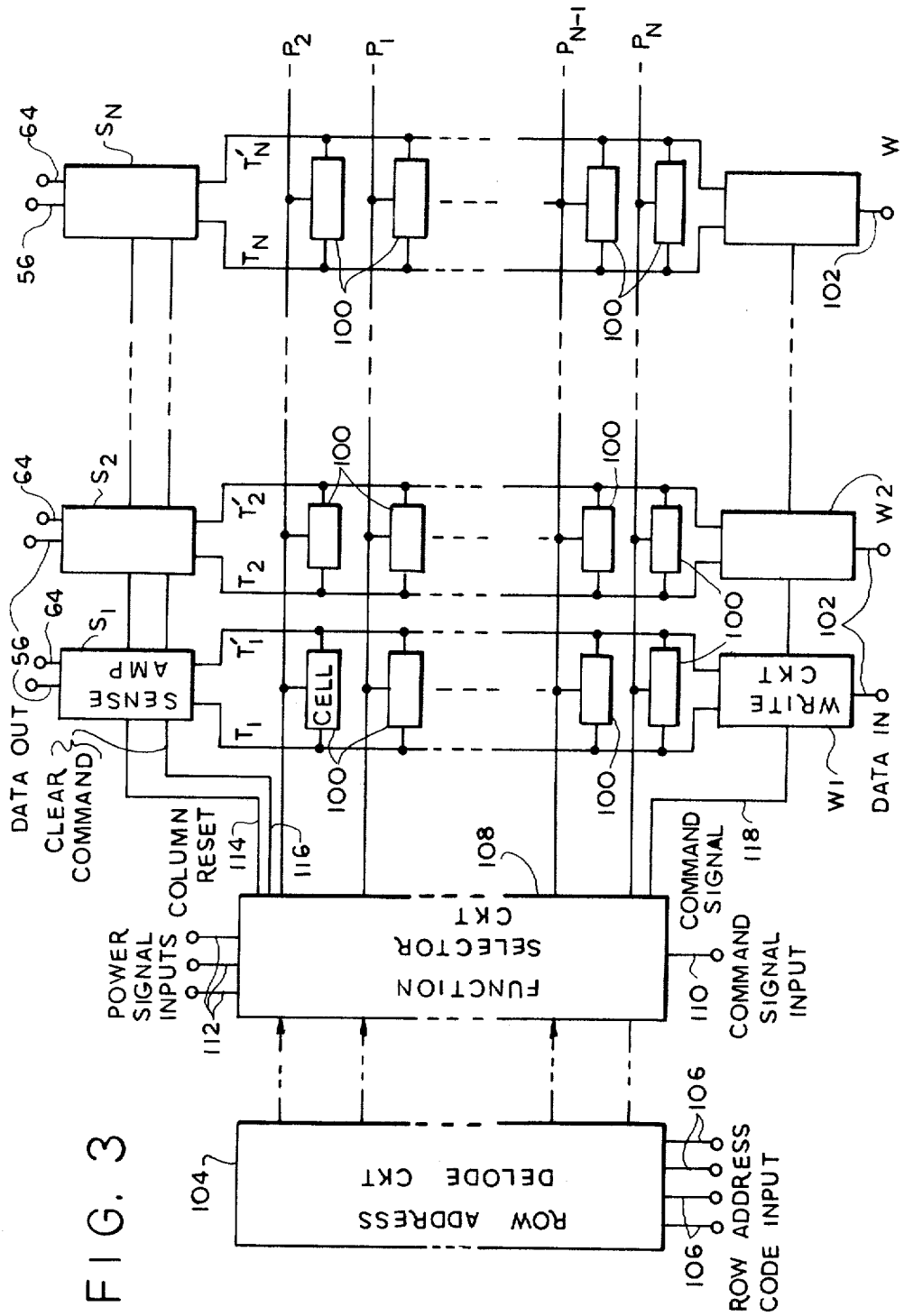
FIG. 3 is a block diagram of a random access memory illustrating an application of the sensing circuit of the present invention.

FIG. 1 illustrates a known configuration of an I²L memory cell which is particularly well suited for use in conjunction with the sensing circuit of the present invention. The cell illustrated in FIG. 1 is the cell disposed in the article authored by Wiedmann, identified above. This cell structure constitutes only one of many structures which may be used in conjunction with the sensing circuit of the present invention. Other cell structures, wherein the state of the cell is reflected in the difference between the current magnitudes at two output nodes, may also be used in conjunction with the sensing circuit of the present invention. The structure of this cell is disclosed herein for illustrative purposes only and should not be construed as being part of the invention herein, or as a limitation thereon.

The cell comprises a power signal input node 10 connected to the injector (emitter) terminals of a pair of grounded base injector transistors 12 and 14. The collector terminals of transistors 12 and 14 are connected to junction nodes 16, 18, respectively. The storage portion of the cell comprises a pair of cross-coupled transistors 20, 22. The base of transistor 20 is connected to junction node 18 and the base of transistor 22 is connected to junction node 16. The output circuit of transistor 20 is connected between node 16 and ground. The output circuit of transistor 22 is connected between node 18 and ground. A pair of data transfer nodes 24, 26 are provided. Data transfer node 24 is connected to junction node 16 through a pass transistor 28. Transfer node 26 is connected to junction node 18 through a pass transistor 30. Pass transistors 28 and 30 have grounded bases. Transistors 12, 14, 28 and 30 are injector transistors, that is, lateral PNP devices which act as current sources, and transistors 20 and 22 are vertical NPN bipolar transistors.

The operation of the I²L memory cell is quite simple. Under stand-by conditions, a relatively low power input is supplied to power input node 10. The power input signal causes injectors 12, 14 to feed current to the cross-coupled storage transistors 20, 22 to maintain the state thereof. One of the cross-coupled storage transistors 20, 22 is conductive and the other is non-conductive, thus representing the state of the cell. In order to change the state of the cell, that is, perform a write operation, the power input signal applied to power input node 10 is lowered, such that the injector current developed by injector transistors 12 and 14 is diminished. A data input signal will be applied to one or the other of the transfer nodes 24, 26. By lowering the injector current, the data input signal is forced through the appropriate one of the transfer transistors 28, 30 to set the flip-flop. After the flip-flop is set, the power signal input is raised back to the stand-by level.

In order to perform a read operation, the power input signal is raised such that the injector current from transistors 12 and 14 is increased. The increase in the injector current causes currents to flow through transfer transistors 28 and 30 onto transfer nodes 24, 26, respectively. One of the transfer nodes 24 and 26 will receive a current magnitude which is slightly higher than the other, depending upon the state of the cell. This difference in current magnitude between the currents on the transfer nodes 24 and 26 is sensed and it is determined which of the current magnitudes is higher. The sensing circuit which determines which of the current magnitudes is higher generates a data output signal which reflects the state of the cell.

It should be appreciated that the difference in current magnitudes between the signals which appear at the two transfer nodes is quite small and, therefore, requires a sensing circuit which is highly sensitive. In addition, during the sensing operation, it is important that no signals be applied to the data transfer nodes 24, 26 which will upset or change the state of the cell. Thus, the sensing circuit used in conjunction with cells of this type must be such that same will not apply any signals to data transfer nodes 24, 26 which will destroy the cell state. In other words, the sensing circuit must operate to permit non-destructive read-out of the cell.

The sensing circuit of the present invention, as schematically illustrated in FIG. 2, is designed to provide these functions. The cell comprises first and second means, generally designated A, adapted to receive first and second input signals, such as the signals from transfer nodes 24 and 26, respectively. Dual input bistable means, generally designated B, are provided for generating an output representative of the degree to which the bistable means inputs are respectively actuated, subsequent to the resetting of the bistable means. Means, generally designated C, are provided for supplying current to the bistable means to energize same. Means, generally designated D, are provided for resetting the bistable means. Further, means, generally designated E, operably connected to the bistable means inputs and to the receiving means, are provided for actuating a selected one of the bistable means inputs to a greater degree, in accordance with which of the first and second receiving means A receives the signal with the greater magnitude.

The first and second receiving means A each comprise a circuit input node and a bipolar transistor, the output circuit of which is connected between the input node and ground. The first receiving means comprises input node 32 connected by an input line or bus 34 to a first input signal source, such as transfer node 24 of the cell illustrated in FIG. 1. Node 32 is connected to the collector of a transistor 36, the emitter of which is connected to ground. Similarly, the second input node 38 is connected to an input line 40, which, in turn, is connected to a second signal source, such as data transfer node 26 of the cell illustrated in FIG. 1. Input node 38 is connected to the collector of a transistor 42, the emitter terminal of which is connected to ground.

The bases of each of transistors 36 and 42 are connected to a common line 44 which, in turn, is connected to receive a clear command signal. During the presence of a clear command signal, transistors 36 and 42 are rendered conductive so as to ground input nodes 32 and 38, respectively, and the input lines associated therewith. Thus, transistors 36 and 42, which comprise a part of the receiving means, operate, in the presence of a clear command signal, to clear the input nodes and the input lines associated therewith.

The dual input bistable means B comprise a pair of cross-coupled data storage transistors 46, 48. Transistors 46 and 48 are vertical NPN transistors whose multi-emitters are operated as collectors and each of which forms a part of an I²L element in conjunction with a lateral PNP current source or injector transistor (described below). Transistor 46 has a first collector 50 connected to a first bistable means input node 52 and a second collector 54 which is connected to a first data output node 56. The emitter of transistor 46 is connected to ground. Transistor 48 has a first collector 58 which is connected to a second bistable means input node 60 and a second collector 62 which is connected to a second data output node 64. The emitter of transistor 48 is connected to ground.

Input node 52 is connected to the base of transistor 48 through a junction node 66. Similarly, input node 60 is connected to the base of transistor 46 through a junction node 68. Junction nodes 66 and 68 are connected to the current supply means C which comprises a pair of lateral PNP injector transistors 70, 72, respectively. Transistors 70 and 72 have grounded bases. Junction node 66 is connected to the collector terminal of transistor 70 and junction node 68 is connected to the collector terminal of transistor 72. The emitter terminals of transistors 70 and 72 are connected to a line 74 which is connected to receive a power input signal. In the presence of the power input signal, transistors 70 and 72 supply current to the bistable means to operate same. When the power input signal is not present, the input current is not supplied to the bistable means and both of the transistors 46 and 48 are rendered non-conductive.

The sensing circuit of the present invention is illustrated in FIG. 2 as having two separate injector transistors 70 and 72 for providing current to the bistable means B. However, it should be appreciated that transistors 70 and 72 can be replaced with a single injector transistor which has a pair of collectors, each of which is connected to one of the junction nodes 66 and 68, respectively. Whether one or two separate injector transistors is provided, the circuit of the present invention functions in the identical manner.

It is necessary, for the proper operation of the sensing circuit of the present invention, that the bistable means B be reset immediately prior to each sensing operation. The resetting of the bistable means is achieved by cutting off the power to the bistable means so as to render cross-coupled transistors 46 and 48 non-conductive. The rendering of transistors 46 and 48 non-conductive wipes out the previous state of the bistable means and permits same to attain a new state dependent upon the difference in magnitude between the signals on input lines 34 and 40.

The resetting of the bistable means can be achieved in one of two ways. The preferable manner of resetting the bistable means is simply to turn off the power signal input applied to line 74 for a short time and, thereafter, reapply the power signal input so as to render the circuit operational. A second way to achieve the same result, without pulsing the power signal input, is to provide a separate resetting means D in the form of a reset transistor 76 (or, if preferred, two identical separate reset transistors), which has (or have) a pair of collectors connected between the injector transistors and junction nodes 66 and 68, respectively. The emitter of the reset transistor 76 is connected to ground. The base of reset transistor 76 is connected to receive a reset command signal. In the presence of the reset command signal, reset transistor 76 is rendered conductive, thereby grounding junction nodes 66 and 68. It will therefore be appreciated that when reset transistor 76 is rendered conductive by the application of the reset command signal, the current supply from injector transistors 70 and 72 to the bistable means is cut off, thereby accomplishing the reset operation.

The bistable circuit actuating means E comprises a pair of transistors 78 and 80. The collector of transistor 78 is connected to bistable circuit input node 52 and the collector of transistor 80 is connected to bistable circuit input node 60. The emitters of each of the transistors 78 and 80 are connected through a node 82 to ground. The bases of transistors 78 and 80 are connected to input nodes 32 and 38, respectively.

Transistors 78 and 80 serve several important functions. Each of the transistors 78 and 80 act as a load for one of the cross-coupled transistors 46, 48 of the bistable means. As each transistor 46, 48 is rendered conductive, it will actuate the bistable circuit input associated therewith to a degree which reflects the conductivity thereof. Because of the amplifying characteristics of the transistors 78 and 80 (each will conduct at a rate equal to the applied base signal times $\beta$), these transistors serve to magnify or intensify the differences between the magnitudes of the input signals connected to the bases thereof, respectively. In addition, transistors 78 and 80 prevent the injector current supplied by injector transistors 70 and 72 from being applied to input nodes 32 and 38. This isolating property prevents the injector currents from transistors 70 and 72 from disrupting or destroying the state of the cell which is being read.

Prior to the application of a read command signal to the memory cell, the receiving means is cleared and the bistable means reset. The clearing operation is accomplished through the application of a clear command signal on line 44 which causes the grounding of input nodes 32 and 38, and the input lines connected thereto, through the output circuits of transistors 36 and 42, respectively. Resetting of the bistable means is accomplished either through the absence of the power input signal on line 74, which causes injector transistors 70 and 72 to cease supplying current at their collectors, or by the application of a reset command signal to transistor 76, which results in the grounding of junction nodes 66 and 68.

The application of the clear command signal ceases at the same time, or slightly before, a read command signal (that is, a power supply signal of increased magnitude is applied to the input signal power node of the memory cell) is applied to an addressed memory cell, such as the one shown in FIG. 1, and described above. Immediately thereafter, the reset operation terminates, either by providing a power input signal on line 74 or by ceasing the application of a reset command signal at the base of transistor 76. The signals applied to data transfer nodes 24 and 26 by the reading of the memory cell are connected by means of lines 34 and 40, respectively, to input nodes 32 and 38, respectively. The application of the signals at input nodes 32 and 38 cause transistors 78 and 80, respectively, to become conductive. The respective conductivities of transistors 78 and 80 are directly dependent upon the current magnitudes of the input signals applied to the bases thereof. In other words, one of the transistors 78 and 80 will become more conductive than the other, depending upon which of the transistors receives an input signal having a greater magnitude.

When the reset operation terminates, the bistable means will seek a stable state in accordance with the relative degree of actuation of the bistable means input nodes 52 and 60, respectively. Bistable means input node 52 is actuated by transistor 78 by the grounding thereof through its output circuit to a degree determined by the input signal at node 32. Similarly, bistable input means 60 is actuated by transistor 80 by the grounding thereof through its output circuit to a degree determined by the magnitude of the signal at node 38. Thus, the degree to which the bistable input nodes 52 and 60 are actuated depends upon the degree to which the transistors 78 and 80, respectively, are rendered conductive. The conductivity of transistors 78 and 80, respectively, is directly dependent upon the relative current magnitudes of the signals applied to the bases thereof.

Thus, if a signal of higher current magnitude is applied to input node 32, transistor 78 will become more conductive than transistor 80. This will cause bistable means input node 52 to be actuated (grounded) to a greater degree than bistable means input node 60. The greater degree of actuation of bistable means input node 52, as compared to that of bistable means input node 60, will cause an imbalance in the bistable means as same is energized. This imbalance will cause transistor 48 to turn off or become non-conductive and will cause transistor 46 to remain conductive, thus setting the bistable means in a stable state.

The state of the bistable means is reflected at data output nodes 56 and 64. Thus, if transistor 46 is conductive, data output 56 will be at near ground, whereas data output node 64 will be high, due to the non-conductivity of transistor 48.

After the sensing operation is completed and the output data noted, the read operation of the cell is disabled and the clear and reset operations are performed again to set the sensing circuit up for the next sensing operation. It is important to note that throughout the operation of the sensing circuit, none of the current supplied to the bistable means by injector transistors 70 and 72 can be fed back through input nodes 32 and 38 to the connected cell because of the isolation function of transistors 78 and 80.

FIG. 3 represents a typical configuration of a random access memory employing a plurality of I²L memory cells of the type illustrated in FIG. 1 and a plurality of sensing circuits of the present invention. Aside from the sensing circuit of the present invention, all other components of the random access memory are of known design and are, therefore, not illustrated in detail herein.

The random access memory comprises a plurality of memory cells 100 arranged in a matrix array comprising a number of rows and columns, only some of which are illustrated. Each cell 100 in a row is connected to a common power supply line, designated P1 . . . Pn, which is connected to the power signal input node of each cell. Each column of cells has first and second data transfer lines, designated T1, T'1; T2, T'2; . . . Tn, T'n, which are connected to data transfer nodes 24 and 26, respectively, of each of the cells in the column. At the bottom of each column, the data transfer lines T, T' are connected as outputs of a write circuit, designated W1 . . . Wn, respectively. At the top of each column, the data transfer lines T, T' are connected as inputs to a sensing circuit, designated S1 . . . Sn, respectively, of the type which forms the present invention. Each of the write circuits, W1 . . . Wn is provided with a separate data-in input 102. Each of the sensing circuits S1 . . . Sn is provided with a pair of data outputs 56 and 64, which reflect the state of a read cell, as described previously.

A row address decode circuit, generally designated 104, is connected to receive a row address code at row address inputs 106. The outputs of row address decode (one for each row) circuit 104 are connected to a function selector circuit 108 which receives a command (read or write) signal at command signal input 110 and a plurality of different level power signals at power signal inputs 112. Function selector circuit has a plurality of outputs connected respectively to one of the row power lines P1 . . . Pn, to a column reset line 114 to a clear command line 116 and a command signal output line 118.

During stand-by operation, the function selector circuit serves to connect the power signal input 112 which receives the stand-by power signal to all of the power row lines P1 . . . Pn. This causes all of the cells 100 to remain in the stand-by condition. When a write operation is to take place, the row address decode circuit 104 receives a row address code on row address code inputs 106, which represents the row in which the cell to be read is located. This information is decoded by circuit 104 and appears as a high input on the line connecting row address decode circuit 104 with function selector circuit 108 associated with the selected row. All other outputs of row address decode circuit remain low. Function selector circuit receives the write command signal at command signal input 110. In accordance with this signal, function selector circuit 108 connects the power signal input having a lower (write) signal level applied thereto with the row power line associated with the selected row. In other words, in the presence of a write command signal, function selector circuit 108 applies a power signal of lower magnitude to the addressed row than the power signal level applied to the non-selected rows.

A column is selected by applying a data-in signal to the input 102 of the appropriate write circuit W1 . . . Wn associated with the column in which the selected cell is located. The write circuits of all other columns remain inoperative. The function selector circuit generates a write command signal on line 118 to the appropriate write circuit. The data input signal is then applied on the appropriate one of the data transfer lines T, T' associated with the selected column. Thus, if column 2 is selected and the information to be written into the addressed cell is a "1", write circuit W2 will apply a high signal on data transfer line T2 and a low signal on data transfer line T'2. On the other hand, if the data to be written in is a zero ("0"), then write circuit W2 will apply a zero to data transfer line T2 and a "1" to data transfer line T'2. In this manner, lowering the input power to the selected cell and applying the appropriate data to the data transfer line in the column of the selected cell, causes the cell to assume the state of the input data.

During the read operation, a read command signal is received at the command signal input 110 of function selector circuit 108. Function selector circuit 108 generates a clear command signal on line 116 which clears all of the inputs for all of the sensing circuits $S_1 \ldots S_n$. In addition, the function selection circuit generates a reset command signal which resets all of the bistable means in each of the sensing circuits $S_1 \ldots S_n$. The row address decode circuit receives the row address input code representing the row of the cell selected to be read. The row address decode circuit 104 decodes the row address code and generates a high signal to the function selector circuit on the output which represents the row of the selected cell. When this output is received by the function selector circuit, the circuit connects the (read) high signal level appearing on one of the power signal inputs 112 to the row power line $P_1 \ldots P_n$ in the selected row, such that all of the cells in the selected row receive a high (read) power signal.

The reset command signal associated with the sensed circuit in the column containing the selected cell is then altered to permit the bistable means in the selected sensing circuit to become operational. As described previously, this can be achieved by providing a power input signal to the selected sensing circuit, or by terminating the signal to the reset transistor therein. The cells in the selected row apply output signals to each of the transfer lines T, T' associated therewith. The signals applied to lines T, T' have different magnitudes in accordance with the state of the cell. The sensing circuit in the selected column senses the difference between the magnitudes of the signals on the transfer lines T, T' of that column and generates a data output at data output nodes 56 and 64 which is representative of the state of the read cell, in the manner which is described in detail above. After the read operation is complete, the power on the selected row power line returns to the stand-by magnitude and the clear command signal and the reset command signals are reapplied to all of the sensing circuits $S_1 \ldots S_n$.

It will now be appreciated that the sensing circuit of the present invention encompasses all of the advantages normally associated with I²L technology, including low power and small space requirements, and high speed. In addition, the sensing amplifier of the present invention is extremely sensitive and capable of sensing differences in current magnitude between two input signals in the nano-ampere range and, possibly, even into the pico-ampere range. Moreover, the sensing operation takes place at high speed and permits non-destructive readout.

While only a single embodiment of the present invention has been disclosed herein for purposes of illustration, it is obvious that many modifications and variations could be made thereto. It is intended to cover all of these variations and modifications which fall within the scope of the present invention, as defined by the following claims:

I claim:

1. An I²L circuit for sensing relatively small differences in signal magnitude between first and second input signals comprising first and second means adapted to receive the first and second input signals, respectively; dual input bistable means for generating an output representative of the relative degree of actuation of said bistable means inputs, subsequent to the resetting of said bistable means; means for supplying current to said bistable means to energize same; means for resetting said bistable means; and means, operably connected to said bistable means inputs and said receiving means, for actuating said bistable means inputs, respectively, to degrees dependent upon the relative magnitudes of the signals applied at said first and second receiving means.

2. The circuit of claim 1, wherein said receiving means comprises means for clearing said circuit inputs.

3. The circuit of claim 1, wherein said resetting means comprises means for deenergizing said bistable means.

4. The circuit of claim 1, wherein said current supply means comprises current injector means and power source means for providing power thereto.

5. The circuit of claim 4, wherein said resetting means comprises means for disabling said power source means.

6. The circuit of claim 4, wherein said current injector means comprises an injector transistor.

7. The circuit of claim 6, wherein said injector transistor has first and second injector terminals operably connected to said bistable means.

8. The circuit of claim 1, wherein said resetting means comprises means for disabling said current supply means.

9. The circuit of claim 8, wherein said current supply means comprises injector means and power source means for providing power thereto.

10. The circuit of claim 9, wherein said disabling means comprises means for grounding the output of said injector means.

11. The circuit of claim 9, wherein said current injector means comprises an injector transistor.

12. The circuit of claim 11, wherein said injector transistor has first and secoond injector terminals operably connected to said bistable means.

13. The circuit of claim 1, wherein said actuation means comprises means for isolating said receiving means from said bistable means.

14. The circuit of claim 1, wherein said actuation means comprises first and second load transistors, each having a control terminal and an output circuit, each of said control terminals being operably connected to a different one of said receiving means, respectively, and each of said output circuits being operably connected between ground and a different one of said bistable means inputs.

15. The circuit of claim 14, wherein each of said control terminals is adapted to receive a different one of said input signals.

16. The circuit of claim 8, wherein said actuation means comprises first and second load transistors, each having a control terminal and an output circuit, each of said control terminals being operably connected to one of said receiving means and each of said output circuits being operably connected between ground and a different one of said bistable means inputs.

17. the circuit of claim 16, wherein each of said control terminals is adapted to receive a different one of said input signals.

18. The circuit of claim 1, wherein said resetting means is responsive to a reset command signal and said clearing means is responsive to a clear command signal, and further comprising means for generating said clear and reset command signals such that said clear command signal terminates prior to said reset command signal.

19. The circuit of claim 4, wherein said bistable means comprises first and second cross-coupled storage transistors.

20. The circuit of claim 19, wherein each of said storage transistors is connected to and energized by said current injector means.

21. The circuit of claim 1, wherein said bistable means comprises first and second cross-coupled storage transistors and wherein said current supply means energizes said storage transistors.

22. The circuit of claim 21, wherein one of said storage transistors has multiple output terminals and wherein said output appears on one of said output terminals.

23. The circuit of claim 19, wherein said storage transistors are vertical NPN transistors and said current supply means comprises a lateral PNP injector transistor.

24. An I²L circuit for sensing relatively small differences in current between signals applied at two input nodes comprising: first and second storage transistors each having a control terminal and an output circuit, first and second junction nodes, the control terminal of said first transistor being connected to said first junction node, the control terminal of said second transistor being connected to said second junction node, the output circuit of said first transistor being connected between said second junction node and ground, the output circuit of said second transistor being connected between said first junction node and ground; injector means for supplying current to said first and second storage transistors to operate same; means for disabling said injector means; and first and second load transistors, each having a control terminal connected to a different one of said input nodes and an output circuit connected between ground and a different one of said junction nodes.

25. The circuit of claim 24, wherein said load transistors comprise means for isolating said input nodes from said injector means.

26. An I²L circuit for sensing relatively small differences in current magnitude between input signals applied at two circuit inputs comprising: bistable means having first and second inputs for generating an output which is a function of the state of said bistable means; means for energizing said bistable means, and means, operably connected between said circuit inputs and said bistable means inputs, for generating unbalanced first and second actuation signals to said bistable means inputs, respectively, said actuation signals being unbalanced in a manner which reflects the relative current magnitudes of said input signals and for setting the state of said bistable means to reflect the unbalance between said actuation signals as said energizing means is actuated.

27. The circuit of claim 26, wherein said actuation signal generating and state setting means further comprises means for isolating said circuit inputs from said energizing means.

28. An I²L memory comprising an I²L memory cell having first and second data transfer outputs which, when said cell is enabled, are adapted to receive first and second data signals respectively from said cell, the relative magnitudes of which represent the state of the cell; means for enabling said cell to transfer said first and second data signals to said outputs; means for clearing said first and second data outputs; I²L means operably connected to said outputs for sensing the relative magnitudes of said data signals and for generating an output signal which is a function thereof, said sensing means comprising bistable means, means for energizing said bistable means, and means for isolating said energizing means from said first and second data transfer outputs.

29. The memory of claim 28, further comprising means for resetting said bistable means.

30. The memory of claim 29, wherein said clearing means is actuated prior to the actuation of said cell.

31. The memory of claim 30, wherein said bistable means is reset subsequent to the deactuation of said clearing means.

32. The memory of claim 29, wherein said resetting means comprises means to disable said energizing means.

33. The memory of claim 29, wherein said isolating means comprises means for magnifying the difference in magnitudes of said first and second data signals and for setting the state of said bistable means in accordance therewith.

34. The memory of claim 29, wherein said bistable means has first and second inputs and the state thereof, after same is reset by said resetting means, is determined by the relative degree to which said inputs are actuated by said isolation means.

35. The memory of claim 34, wherein said isolation means comprises means for generating first and second signals to said bistable means inputs, said signals having magnitudes determined by the relative magnitudes of said data signals.

* * * * *